(12) United States Patent
Ikemoto et al.

(10) Patent No.: US 9,627,289 B2
(45) Date of Patent: Apr. 18, 2017

(54) SEMICONDUCTOR DEVICE

(71) Applicant: J-Devices Corporation, Usuki-shi, Oita (JP)

(72) Inventors: Yoshihiko Ikemoto, Yokohama (JP); Shigenori Sawachi, Yokohama (JP); Fumihiko Taniguchi, Yokohama (JP); Akio Katsumata, Yokohama (JP)

(73) Assignee: J-DEVICES CORPORATION, Usuki-shi, Oita (JP)

( * ) Notice: Subject to any disclaimer, the term of this patent is extended or adjusted under 35 U.S.C. 154(b) by 0 days.

(21) Appl. No.: 14/964,121

(22) Filed: Dec. 9, 2015

(65) Prior Publication Data

US 2016/0181194 A1 Jun. 23, 2016

(30) Foreign Application Priority Data

Dec. 18, 2014 (JP) .................. 2014-256198

(51) Int. Cl.

| | |
|---|---|
| *H01L 23/473* | (2006.01) |
| *H01L 23/31* | (2006.01) |
| *H01L 23/522* | (2006.01) |
| *H01L 23/00* | (2006.01) |
| *H01L 23/552* | (2006.01) |
| *H01L 23/498* | (2006.01) |

(52) U.S. Cl.
CPC ...... *H01L 23/3142* (2013.01); *H01L 23/3128* (2013.01); *H01L 23/5227* (2013.01); *H01L 23/552* (2013.01); *H01L 24/19* (2013.01); *H01L 24/20* (2013.01); *H01L 23/49816* (2013.01); *H01L 2224/04105* (2013.01); *H01L 2224/12105* (2013.01); *H01L 2224/32225* (2013.01); *H01L 2224/32245* (2013.01); *H01L 2224/73267* (2013.01)

(58) Field of Classification Search
USPC ........................................................ 257/774
See application file for complete search history.

(56) References Cited

U.S. PATENT DOCUMENTS

| | | | | |
|---|---|---|---|---|
| 2007/0030628 | A1* | 2/2007 | Yamamoto | H01G 4/232 361/311 |
| 2009/0315192 | A1* | 12/2009 | Usami | H01L 21/561 257/787 |
| 2010/0084175 | A1* | 4/2010 | Suzuki | H01L 21/4857 174/260 |
| 2010/0244234 | A1* | 9/2010 | Sonobe | H01L 21/561 257/693 |
| 2015/0102499 | A1* | 4/2015 | Coullomb | H01L 23/3677 257/774 |

FOREIGN PATENT DOCUMENTS

| | | |
|---|---|---|
| JP | 2003-197662 A | 7/2003 |
| JP | 2010-219489 A | 9/2010 |

\* cited by examiner

*Primary Examiner* — Thao P Le
(74) *Attorney, Agent, or Firm* — Flynn, Thiel, Boutell & Tanis, P.C.

(57) ABSTRACT

The present invention is to provide a semiconductor device in which the generation of the eddy current in a metal flat plate is reduced, and the Q value of the RF circuit of the semiconductor device is improved even using the metal flat plate as a support.

6 Claims, 9 Drawing Sheets

SEMICONDUCTOR DEVICE

BACKGROUND OF THE INVENTION

1. Field of the Invention

The present invention relates to a semiconductor device and a method for producing the same. In particular, the present invention relates to a semiconductor device having a Panel scale Fan-out package structure in which the thin film wiring step and the assembling step are performed on a large panel scale.

2. Description of the Related Art

Recent years have seen demands for higher functionality and reduced size and weight in electronic equipment, and accordingly, progress has been made in the high-density integration of electronic components and also in high-density mounting, and semiconductor devices used in such electronic equipment have also been becoming increasingly compact in size more than before.

As a method for manufacturing a semiconductor device such as an LSI unit or an IC module, firstly, a plurality of semiconductor chips judged to be good quality by an electrical properties test are arranged and bonded in a prescribed configuration on a supporting plate, with the element circuit surface facing downwards, whereupon, for instance, a resin sheet is arranged thereon and molded by applying heat and pressure, thereby sealing the plurality of semiconductor chips in a lump, whereupon the supporting plate is peeled away, the resin sealed body is cut and machined to a prescribed shape (for example, a circular shape), an insulating material layer is formed on the element circuit surfaces of the semiconductor chips buried in the sealed resin body, openings are formed in accordance with the positions of the electrode pads of semiconductor chips on the insulating material layer, and a wiring layer is then formed on top of the insulating material layer, in addition to which conducting sections (via sections) connected to the electrode pads of the semiconductor chips are formed inside the openings, whereupon a solder resist layer is formed, solder balls, which are to be external electrode terminals, are formed successively, and each semiconductor chip is then cut out individually, one by one, to complete the semiconductor devices (for example, see Japanese Patent Publication No. 2003-197662).

However, in a conventional semiconductor device obtained in this way, when sealing with resin the plurality of semiconductor chips all together, the resin contracts upon curing and since the amount of contraction does not necessarily comply with the design, the positions after curing of the resin may deviate from the design positions, depending on the arrangement positions of the semiconductor chips, and in the semiconductor chips having positional deviation of this kind, positional deviation occurs between the via sections formed in the openings of the insulating material layer and the electrode pads of the semiconductor chips, and hence there is a problem in that connection reliability declines.

A semiconductor device which resolves this problem is described in Japanese Patent Publication No. 2010-219489.

FIG. 8 shows the basic structure of this device.

The semiconductor device 20 comprises a support plate (metal flat plate) 1 constituted by a metal, a semiconductor chip 2 being disposed with an element circuit surface (front surface) facing upwards, on one main surface of the metal flat plate 1, and the surface on the opposite side to the element circuit surface (rear surface) being fixed to the metal flat plate 1 by adhesive 3. Only one insulating material layer 4 is formed on whole of the main surface of the metal flat plate 1 so as to cover the element circuit surface of the semiconductor chip 2. A wiring layer 5 made from a conductive metal, such as copper, is formed on top of this single insulating material layer 4, and one portion thereof is extracted to a peripheral region of the semiconductor chip 2. Furthermore, a conductive portion (via portion) 6 which electrically connects an electrode pad (not illustrated) of the semiconductor chip 2 and the wiring layer 5 is formed on the insulating material layer 4 formed on top of the element circuit surface of the semiconductor chip 2. This conductive portion 6 is formed in an integrated fashion, together with the wiring layer 5. Moreover, a plurality of solder balls 7 which are external electrodes are formed at prescribed positions on the wiring layer 5. Furthermore, a protective layer such as a wiring protection layer (solder resist layer) 8 is formed on top of the insulating material layer 4, and on top of the wiring layer 5 apart from the junctions with the solder balls 7.

This device contributes to the high-density integration and the reduction in weight and size of the electronic components that have been required considerably.

SUMMARY OF THE INVENTION

1. Problems to be Solved by the Invention

In the semiconductor device described in the Japanese Patent Publication No. 2010-219489, in order to reduce the warping of the semiconductor device in the production step, a thick and hard metal flat plate made of SUS or 42 alloy is used.

In the recent LSI, it has been important to form a passive element such as a resistance, a condenser, and an inductor in addition to an active element such as a MOS transistor and a bipolar transistor as internally mounted elements in the metal flat plate.

However, there is a problem in that the metal flat plate impairs the characteristics of an RF circuit formed on an LSI chip such as, for example, an inductor used in LNA (Low Noise Amplifier) or VCO (Voltage Controlled Oscillator) and reduces the performance of the device. There is an option of using a substance other than a metal as a material for the metal flat plate. However, under present circumstances, a hard metal is used considering the heat radiation characteristics and the warping of PKG.

The present invention is intended to provide a semiconductor device in which the generation of the eddy current in a metal flat plate is reduced, and the Q value of the RF circuit of the semiconductor device is improved even using the metal flat plate as a support.

2. Means for Solving the Problems

The inventors of the present invention conducted earnest studies and found that the problem can be solved by causing an insulating material to intervene between a metal flat plate as a support and a semiconductor chip and reached the present invention.

That is the present invention is as described below.

(1) A semiconductor device comprising:
a metal flat plate;
a first insulating material layer formed on one main surface of the metal flat plate;
a semiconductor chip mounted on the surface of the first insulating material layer via an adhesion layer with an element circuit surface oriented upward;

a second insulating material layer that seals the semiconductor chip and the periphery thereof;

a wiring layer that is provided in the second insulating material layer and is partially extended to a peripheral region of the semiconductor chip;

a conductive portion that is provided in the second insulating material layer and connects an electrode on the element circuit surface of the semiconductor chip and the wiring layer; and an external electrode formed on the wiring layer.

(2) A semiconductor device comprising:

a metal flat plate;

a first insulating material layer formed on one main surface of the metal flat plate;

a semiconductor chip;

a second insulating material layer that encapsulates the semiconductor chip and the periphery thereof;

a wiring layer that is provided in the second insulating material layer and is partially extended to a peripheral region of the semiconductor chip;

a conductive portion that is provided in the second insulating material layer and connects an electrode on the element circuit surface of the semiconductor chip and the wiring layer; and a metal via that is provided in the insulating material layers and is electrically connected to the wiring layer, wherein the semiconductor chip is provided in plurality, the semiconductor chip that is closest to the metal flat plate is fixed on the surface of the first insulating material layer via an adhesion layer with the element circuit surface oriented upward, and the other semiconductor chips are laminated via an insulating material that forms the second insulating material layer with the element circuit surfaces oriented toward the wiring layer side.

(3) The semiconductor device according to item (2) above, wherein the plurality of semiconductor chips are arranged so that the position of an RF circuit of each semiconductor chip does not overlap with an adjacent semiconductor chip.

(4) The semiconductor device according to any one of items (1) to (3) above, wherein the thickness of the first insulating material layer is 20 µm or more.

(5) The semiconductor device according to any one of items (1) to (4) above, wherein the first insulating material layer is formed of two or more insulating material layers.

(6) The semiconductor device according to any one of items (1) to (4) above, wherein a portion of the metal flat plate that faces the semiconductor chip has a concave portion, and the concave portion is filled with a first insulating material.

The semiconductor device of the present invention can exert the following effect.

The Q value of the RF circuit (inductor or the like) of the semiconductor device using a metal plate can be increased.

DETAILED DESCRIPTION OF THE PREFERRED EMBODIMENTS

The embodiments of the present invention are described below. Although the embodiments are described below with reference to the drawings, the drawings are merely provided in order to illustrate the embodiments, and the present invention is not limited by the drawings.

Figure 9:
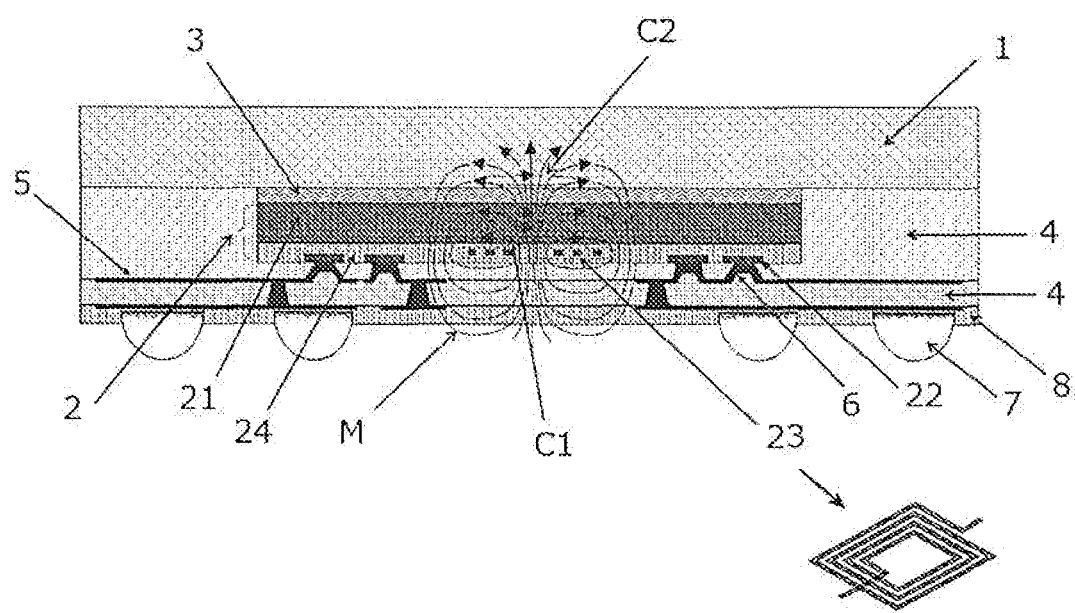
FIG. 9 is a view explaining action of a magnetic flux generated by an RF circuit in a conventional semiconductor device.

Based on FIG. 9 showing a conventional semiconductor device, a cause of the reduction in performance of an RF circuit in the semiconductor device is described.

The case where a Si substrate is used as a semiconductor substrate, and an inductor is used as an RF circuit is described below as an example.

When a semiconductor device is activated, a current flows in an inductor 23.

When a current flows in the inductor 23, a magnetic flux (magnetic field) M is generated as shown in an arrow in the figure.

When the generated magnetic flux M enters the Si substrate 21, a first eddy current C1 is generated in the Si substrate 21 as shown in the arrow since Si is a semiconductor, and a first power loss occurs.

Moreover, a magnetic flux is generated also in the metal flat plate 1, so that a second eddy current C2 is generated, and a second power loss occurs.

As the semiconductor chip 2 is thin, the metal flat plate 1 is close to the inductor 23, an eddy current is prone to be generated in the metal flat plate 1, and a power loss is increased. In the a semiconductor device having a Panel scale Fan-out package structure in which the thin film wiring step and the assembling step are performed on a large panel scale, the thickness of the semiconductor chip 2 is 50 µm which is thin, and thus, an eddy current is prone to be generated.

As described above, by the magnetic flux M generated by the inductor 23, eddy currents C1 and C2 are generated in the Si substrate 21 and the metal flat plate 1, a power loss is increased, and the Q value showing the characteristics of the inductor is reduced compared with the semiconductor device using no metal flat plate as a support.

The Q value is a performance index of an inductor, and shows the extent of power loss generated in the inductor. A larger Q value means a smaller power loss of the inductor, and therefore the inductor has a higher performance. The increase in Q value is really important for improving the performance of the integrated circuit (RFIC) processing a high-frequency signal. In a device such as a mobile phone that specifically requires low power consumption, the power consumption can be significantly reduced by slightly improving the Q value of the inductor, and thus, a high-performance inductor having a high Q value is required.

In the semiconductor device of the present invention, the reduction in Q value of the inductor in the semiconductor device is prevented by intervening the insulating material layer between the metal flat plate as a support in the semiconductor device and the semiconductor chip supported by this metal flat plate.

First Embodiment

Figure 1:
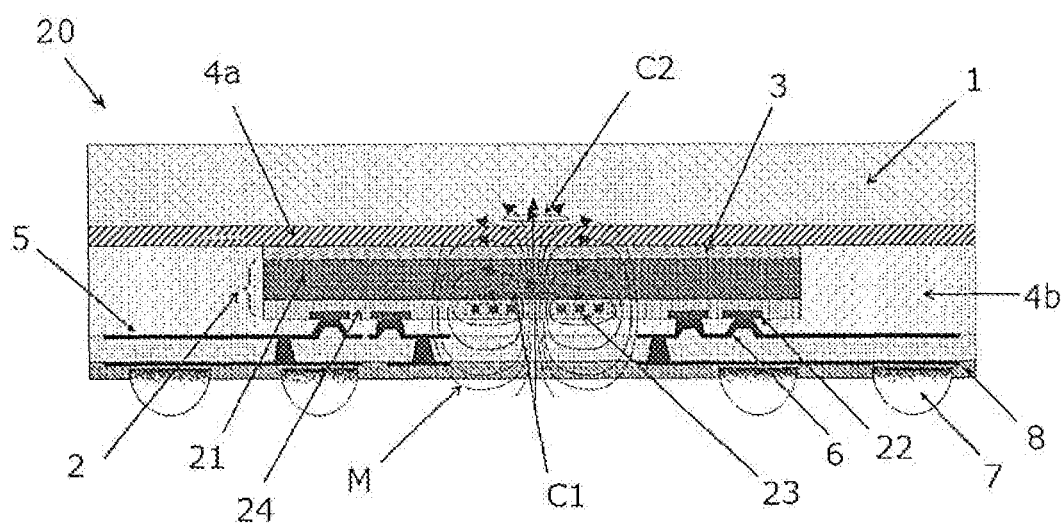
FIG. 1 is a cross-sectional view of a semiconductor device of a first embodiment according to the present invention.

FIG. 1 is a longitudinal cross-sectional view showing an embodiment of a semiconductor device according to the present invention.

A semiconductor device 20 shown in FIG. 1 includes: a metal flat plate 1, a semiconductor chip 2, an insulating material layer 4a, an insulating material layer 4b, a wiring layer 5, a conductive portion 6, and an external electrode 7.

The semiconductor chip 2 includes a silicon substrate 21, an electrode 22, an inductor 23, and a passivation film 24. The passivation film 24 has a function of protecting the semiconductor from being contaminated with impurities and is, for example, formed of a silicon oxide film ($SiO_2$), a silicon nitride film (SiN), or polyimide film (PI).

The first insulating material layer 4a is formed on the entire of one main surface of the metal flat plate 1.

A surface opposite to the element circuit surface of the semiconductor chip 2 is fixed on the surface of this first insulating material layer 4a with an adhesive 3.

The second insulating material layer 4b is formed on the element circuit surface of the semiconductor chip 2 fixed on the surface of the first insulating material layer 4a and the main surface of the metal flat plate 1 so as to be linked with them.

An opening is formed in the second insulating material layer 4b on the electrode 22 arranged on the element circuit surface of the semiconductor chip 2. The conductive portion 6 is formed in this opening so as to be connected to the electrode 22 of the semiconductor chip. This conductive portion 6 is formed on the second insulating material layer 4b and is connected electrically to the wiring layer 5 extended partially to the peripheral region of the semiconductor chip 2.

The wiring layer 5 is electrically connected to the external electrode 7.

The wiring protection layer 8 is formed on the insulating material layer 4b and on the wiring layer 5 except for the part joined to the external electrode 7. The wiring protection layer 8 may be formed of the material that is the same as or different from the insulating material of the insulating material layer 4b.

Figure 2:
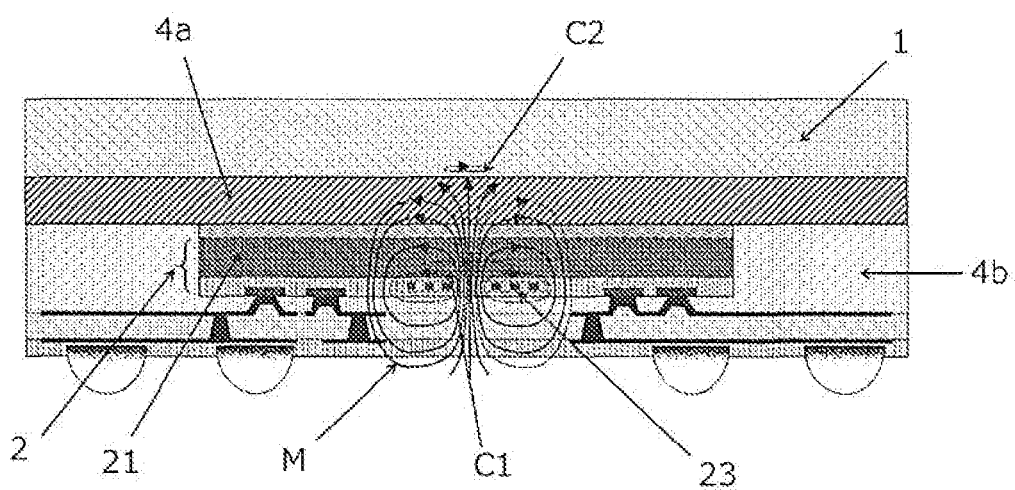
FIG. 2 is a cross-sectional view showing another form of the semiconductor device of the first embodiment of the present invention.

FIG. 2 is a view in which the thickness of the first insulating material layer 4a is larger in the semiconductor device shown in FIG. 1.

When the thickness of the first insulating material layer 4a is increased, the distance between the inductor 23 and the metal flat plate 1 is increased, an eddy current generated in the metal flat plate 1 by a magnetic flux generated by the inductor 23 is reduced, and thus, the reduction in Q value of the inductor can be prevented.

Figure 3A:
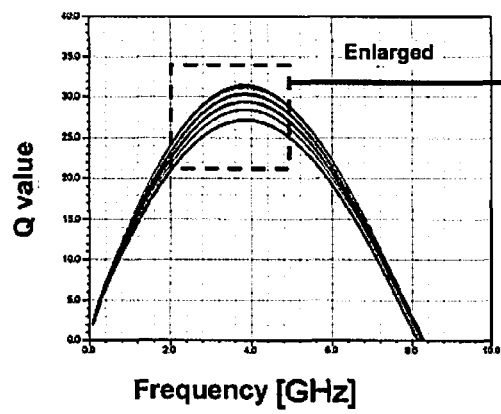
FIGS. 3(a) and (b) are graphs showing a relationship between the thickness and the Q value of the insulating material layer between the metal flat plate and the semiconductor chip.

FIG. 3(a) is a graph showing a relationship between the frequency and the Q value at the time when the thickness of the first insulating material layer 4a in the semiconductor device shown in FIG. 2 is changed, and FIG. 2(b) is an enlarged view of the graph. In the conventional example, the first insulating material layer 4a is not provided.

The results shown in FIG. 3 demonstrate that by providing the first insulating material layer 4a the Q value is higher compared with the conventional one, and the Q values is increased, i.e., a power loss is reduced by increasing the thickness of the first insulating material layer 4a. This is because, by providing the first insulating material layer 4a, the distance between the inductor 23 and the metal flat plate 1 is increased, and an eddy current generated in the metal flat plate 1 by a magnetic flux generated by the inductor 23 is reduced, and thus, the Q value of the inductor cannot be reduced.

Figure 3B:
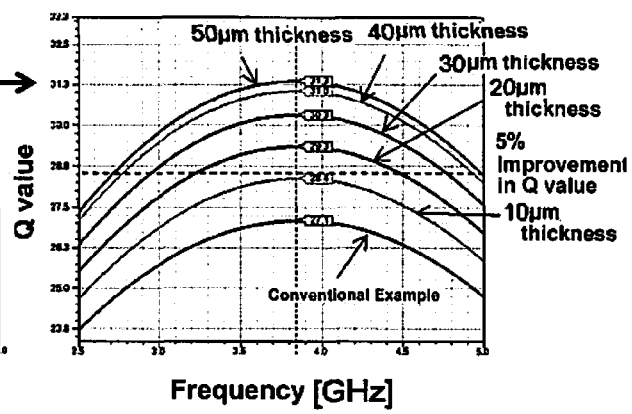

Moreover, as shown in FIG. 3(b), it is demonstrated that, by setting the thickness of the first insulating material layer 4a to 20 µm or more, the effect of increasing 5% or more of the Q value compared with the conventional example can be obtained.

Second Embodiment

Figure 4:
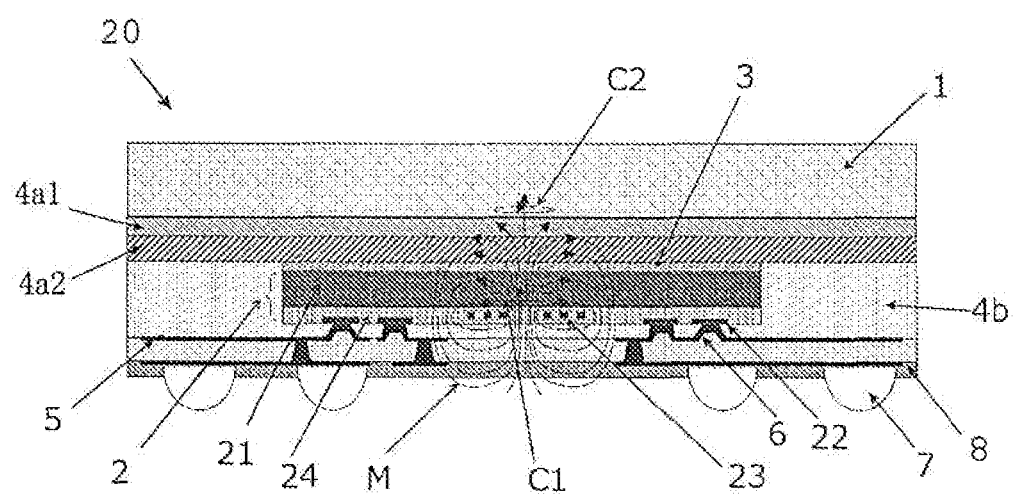
FIG. 4 is a cross-sectional view of a semiconductor device of a second embodiment according to the present invention.

FIG. 4 is a cross-sectional view of a semiconductor device of a second embodiment according to the present invention.

FIG. 4 is a view in which the first insulating material layer 4a is formed of two layers of an insulating material layer 4a1 and an insulating material layer 4a2 in the semiconductor device shown in FIG. 1. The insulating material layer may be formed of three or more layers. The plurality of insulating material layers may be the same kinds or different kinds of materials. By using the plurality of insulating material layers, the thickness of the first insulating material layer can be increased, the distance between the inductor 23 and the metal flat plate 1 is increased, an eddy current generated in the metal flat plate 1 is reduced by a magnetic flux generated by the inductor 23, and thus, the reduction in Q value of the inductor can be prevented.

Third Embodiment

Figure 5:
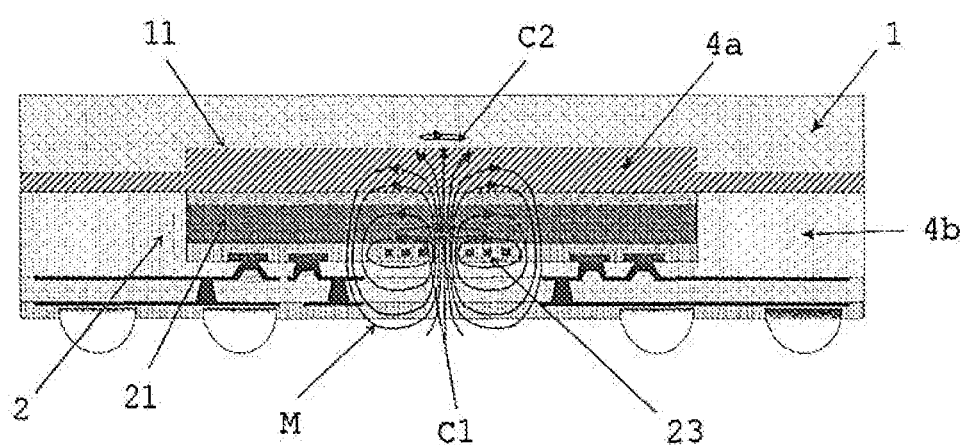
FIG. 5 is a cross-sectional view of a semiconductor device of a third embodiment according to the present invention.

FIG. 5 is a cross-sectional view of a semiconductor device of a third embodiment according to the present invention.

The configuration of the semiconductor device of the present embodiment is a change in structure of the metal flat plate in the semiconductor device shown in FIG. 1.

As shown in FIG. 5, a concave portion 11 is formed on the surface of a metal flat plate 1, facing a semiconductor chip 2. When this concave portion 11 is filled with a first insulating material, the thickness of a first insulating material layer 4a is increased by the depth of the concave portion 11, the distance between the metal flat plate 1 and the semiconductor chip 2 is further increased. Therefore, the semiconductor device of the present embodiment can effectively reduce the generation of eddy current without increasing the thickness of the entire semiconductor device, compared with the semiconductor shown in FIG. 2.

Fourth Embodiment

Figure 6:
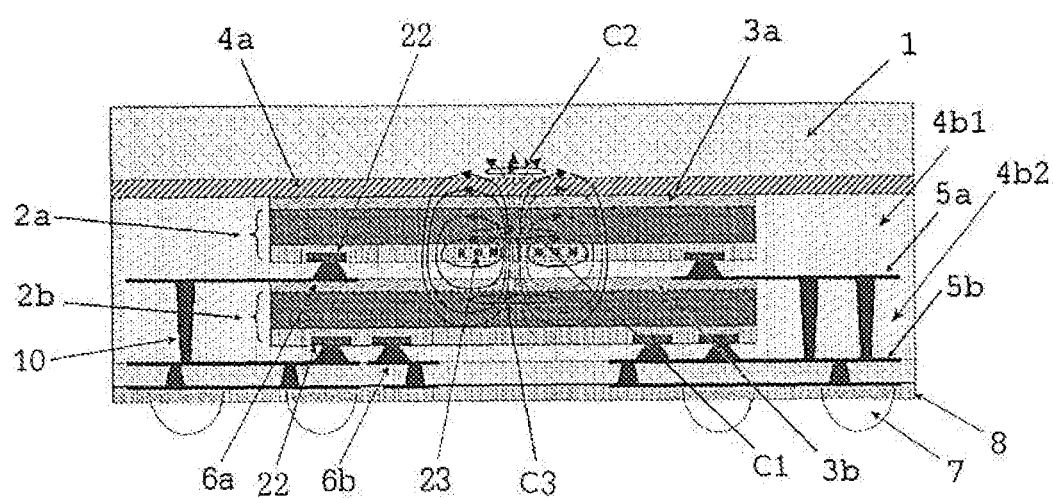
FIG. 6 is a cross-sectional view of a semiconductor device of a fourth embodiment according to the present invention.

FIG. 6 is a cross-sectional view of a semiconductor device of a fourth embodiment according to the present invention.

The semiconductor device of the present embodiment has a structure in which two semiconductor chips 2 (a first semiconductor chip 2a and a second semiconductor chip 2b) are laminated and arranged.

As shown in the first embodiment, the first insulating material layer 4a is formed on one main surface of a metal flat plate 1.

The surface of a first semiconductor chip 2a, opposite to the element circuit surface, is fixed on the surface of this first insulating material layer 4a via an adhesive 3a.

A second insulating material layer 4b1 is formed on the element circuit surface of the semiconductor chip 2a fixed on the surface of the first insulating material layer 4a and the main surface of the metal flat plate 1 so as to be linked with them, and thus, the semiconductor chip 2a is sealed.

An opening is formed in the second insulating material layer 4b1 on an electrode 22 arranged on the element circuit surface of the semiconductor chip 2a. A conductive portion 6a is formed in this opening so as to be connected with an electrode 22 of the semiconductor chip 2a, and this conductive portion 6a is formed on the second insulating material layer 4b1 and is connected electrically to a first wiring layer 5a, which is partially extended to the peripheral region of the semiconductor chip 2.

The surface opposite to the element circuit surface of the second semiconductor chip 2b is fixed on the surface of the second insulating material layer 4b1 with an adhesive 3b.

A second insulating material layer 4b2 is formed on the element circuit surface of the semiconductor chip 2b, the surface of the second insulating material layer 4b1, and the first wiring layer 5a except for a connection portion of an interlayer via portion 10 described below.

The kind of the material of the second insulating material layer 4b1 is the same as that of the material of the second insulating material layer 4b2.

An opening is formed in the second insulating material layer 4b2 on the electrode 22 arranged on the element circuit surface of the semiconductor chip 2b. A conductive portion 6b is formed in this opening so as to be connected with the electrode 22 of the semiconductor chip 2b. This conductive portion 6b is formed on the second insulating material layer 4b2 and is electrically connected to a second wiring layer 5b partially extended to the peripheral region of the semiconductor chip 2b.

An opening is formed in the second insulating material layer 4b2 in the peripheral region of the second semiconductor chip 2b, and the interlayer via portion 10 that electrically connects the first wiring layer 5a and the second wiring layer 5b is formed in this opening. An external electrode 7 such as a solder ball is formed at the predetermined position of the second wiring layer 5b, and a wiring protection layer 8 is formed on the second insulating material layer 4b2 and the second wiring layer 5b except for the joint portion of the external electrode 7.

An interlayer protection layer may be provided on the second insulating material layer 4b1 and the first wiring layer 5a except for the connection portion of the interlayer via portion 10.

In the fourth embodiment configured as described above, an effect of improving the Q value is obtained as in the semiconductor device shown in FIG. 1.

The semiconductor chip of the fourth embodiment has a structure in which two semiconductor chips 2a and 2b are laminated and arranged, and thus, the connection reliability between the electrode of each semiconductor chip 2 and the wiring layer is high, and a semiconductor device that can be applied to miniaturization of the electrode can be obtained with a high yield and at low cost.

Also in the present embodiment, as in the third embodiment, a concave portion 11 may be formed on the surface of the metal flat plate 1, facing the semiconductor chips 2, and the concave portion 11 may be filled with the first insulating material. Thus, the thickness of the first insulating material layer 4a can be increased by the depth of the concave portion 11, the distance between the metal flat plate 1 and each semiconductor chip 2 is increased, and the generation of the eddy current can be effectively reduced.

The fourth embodiment shows a structure in which two semiconductor chips 2 are laminated and arranged, but the structure may be a structure in which three or more semiconductor chips are laminated and arranged. In the laminate structure of the three or more semiconductor chip, a structure that is the same as the laminate structure of the second semiconductor chip 2b, the second insulating material layer 4, the second wiring layer 5b, and the interlayer via portion 10 on the second wiring layer 5b laminated is stacked by the number of semiconductor chips. Then, the wiring protection layer is formed on the wiring layer that is the outermost layer, and an external electrode 7 is formed at the predetermined position, and thus, the semiconductor device is completed.

Fifth Embodiment

Figure 7:
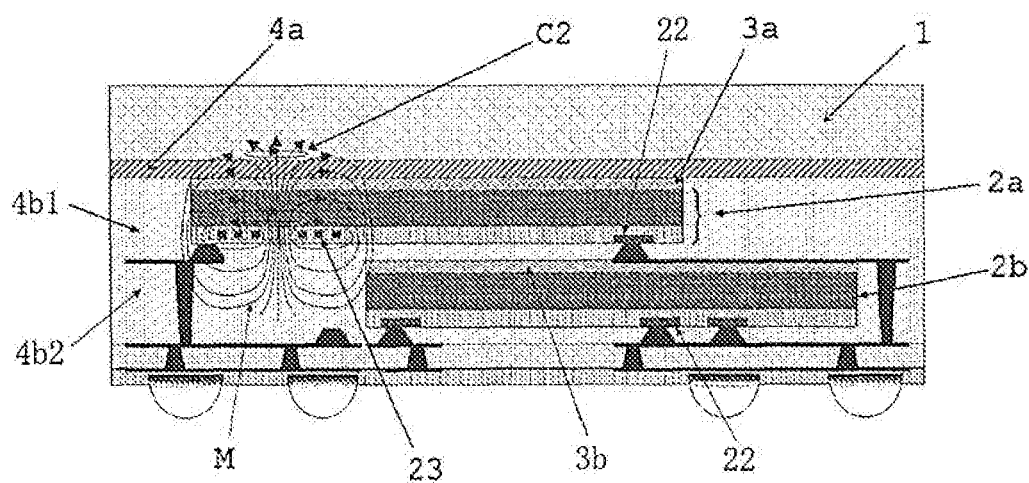
FIG. 7 is a cross-sectional view of a semiconductor device of a fifth embodiment according to the present invention.
Figure 8:
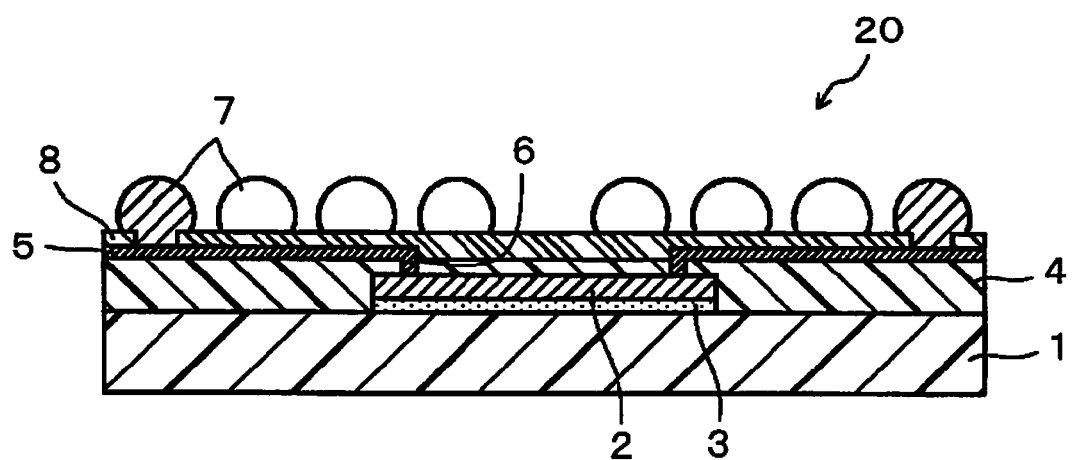
FIG. 8 is a cross-sectional view of a conventional semiconductor device.

FIG. 7 is a cross-sectional view of a semiconductor device of a fifth embodiment according to the present invention.

In the semiconductor device of the fourth embodiment, the first semiconductor chip 2a and the second semiconductor chip 2b are arranged in the state of being laminated in the horizontal direction. However, with such arrangement, as shown in FIG. 6, by a magnetic flux generated in the inductor 23 provided in the first semiconductor chip, a third eddy current C3 is generated in the Si substrate of the second semiconductor chip 2b, and a third power loss occurs.

FIG. 7 shows the semiconductor device of the fifth embodiment in which the generation of the third eddy current C3 in the fourth embodiment can be prevented.

In the semiconductor device shown in FIG. 7, the horizontal position of the inductor 23 of the first semiconductor chip 2a does not overlap with the horizontal position of the second semiconductor chip 2b.

With such arrangement, a magnetic flux generated in the inductor 23 of the first semiconductor chip 2a does not generate the third eddy current in the Si substrate of the second semiconductor chip 2b. Therefore, the Q value of the inductor in the semiconductor device of the third embodiment is improved, compared with that in the semiconductor device of the second embodiment.

What is claimed is:

1. A semiconductor device comprising:
   a metal flat plate;
   a first insulating material layer formed on one main surface of the metal flat plate;
   a semiconductor chip mounted on the surface of the first insulating material layer via an adhesion layer with an element circuit surface oriented upward;
   a second insulating material layer that seals the semiconductor chip and the periphery thereof;
   a wiring layer that is provided in the second insulating material layer and is partially extended to a peripheral region of the semiconductor chip;
   a conductive portion that is provided in the second insulating material layer and connects an electrode on the element circuit surface of the semiconductor chip and the wiring layer; and
   an external electrode formed on the wiring layer.

2. A semiconductor device comprising:
   a metal flat plate;
   a first insulating material layer formed on one main surface of the metal flat plate;
   a semiconductor chip;

a second insulating material layer that encapsulates the semiconductor chip and the periphery thereof;

a wiring layer that is provided in the second insulating material layer and is partially extended to a peripheral region of the semiconductor chip;

a conductive portion that is provided in the second insulating material layer and connects an electrode on the element circuit surface of the semiconductor chip and the wiring layer; and a metal via that is provided in the insulating material layers and is electrically connected to the wiring layer, wherein the semiconductor chip is provided in plurality, the semiconductor chip that is closest to the metal flat plate is fixed on the surface of the first insulating material layer via an adhesion layer with the element circuit surface oriented upward, and the other semiconductor chips are laminated via an insulating material that forms the second insulating material layer with the element circuit surfaces oriented toward the wiring layer side.

3. The semiconductor device according to claim 2, wherein the plurality of semiconductor chips are arranged so that the position of an RF circuit of each semiconductor chip does not overlap with an adjacent semiconductor chip.

4. The semiconductor device according to claim 1, wherein the thickness of the first insulating material layer is 20 μm or more.

5. The semiconductor device according to claim 1, wherein the first insulating material layer is formed of two or more insulating material layers.

6. The semiconductor device according to claim 1, wherein a portion of the metal flat plate that faces the semiconductor chip has a concave portion, and the concave portion is filled with a first insulating material.

* * * * *